United States Patent [19]

Kashimura

[11] Patent Number: 5,233,240
[45] Date of Patent: Aug. 3, 1993

[54] SEMICONDUCTOR DECODING DEVICE COMPRISING AN MOS FET FOR DISCHARGING AN OUTPUT TERMINAL

[75] Inventor: Masahiko Kashimura, Tokyo, Japan
[73] Assignee: NEC Corporation, Tokyo, Japan
[21] Appl. No.: 794,525
[22] Filed: Nov. 19, 1991

[30] Foreign Application Priority Data

Nov. 20, 1990 [JP] Japan .................................. 2-315343

[51] Int. Cl.⁵ ........................................ H03K 19/0948
[52] U.S. Cl. ...................................... 307/449; 307/452
[58] Field of Search ............... 307/449, 451, 452, 463, 307/481

[56] References Cited

U.S. PATENT DOCUMENTS

| | | | |
|---|---|---|---|
| 3,857,046 | 12/1974 | Varadibriarwood et al. | 307/449 |
| 4,471,240 | 9/1984 | Novosel | 307/481 |
| 4,581,548 | 4/1986 | Young | 307/463 |
| 4,689,494 | 8/1987 | Chen et al. | 307/451 |
| 4,730,133 | 3/1988 | Yoshida | 307/452 |
| 5,022,010 | 6/1991 | Chan | 307/463 |

Primary Examiner—Edward P. Westin
Assistant Examiner—Benjamin D. Driscoll
Attorney, Agent, or Firm—Whitham & Marhoefer

[57] ABSTRACT

For implementation typically as an IC, a semiconductor decoding device comprises an additional MOS FET (26) of a first conductivity type between ground and output terminals, each (12) of which is connected to a power supply terminal (19) through a load MOS FET (18) of a second conductivity type and to a parallel circuit (13) of a plurality of MOS FET's (14-1etc) of the first conductivity type. Connected to the additional MOS FET and such load MOS FET's and supplied with a control input signal, a charge control section (27) puts the additional MOS FET in a conductive and a non-conductive state while putting each load MOS FET in an off and an on state. Preferably, a current limiting MOS FET (28) of the second conductivity type is connected between the supply terminal and the load MOS FET's and to a current limiting circuit (31–33) for limiting a load current which flows through the current limiting MOS FET and each load MOS FET put in the on state. Alternatively, the current limiting MOS FET is connected between each output terminal and the supply terminal. In this event, a current control circuit is supplied with the control input signal to put the additional MOS FET in the conductive and the non-conductive state while putting and isolating the current limiting MOS FET in an off state and from the control input signal. Another control circuit is supplied with another control input signal to put in an on state the current limiting MOS FET isolated from the first-mentioned control input signal.

3 Claims, 4 Drawing Sheets

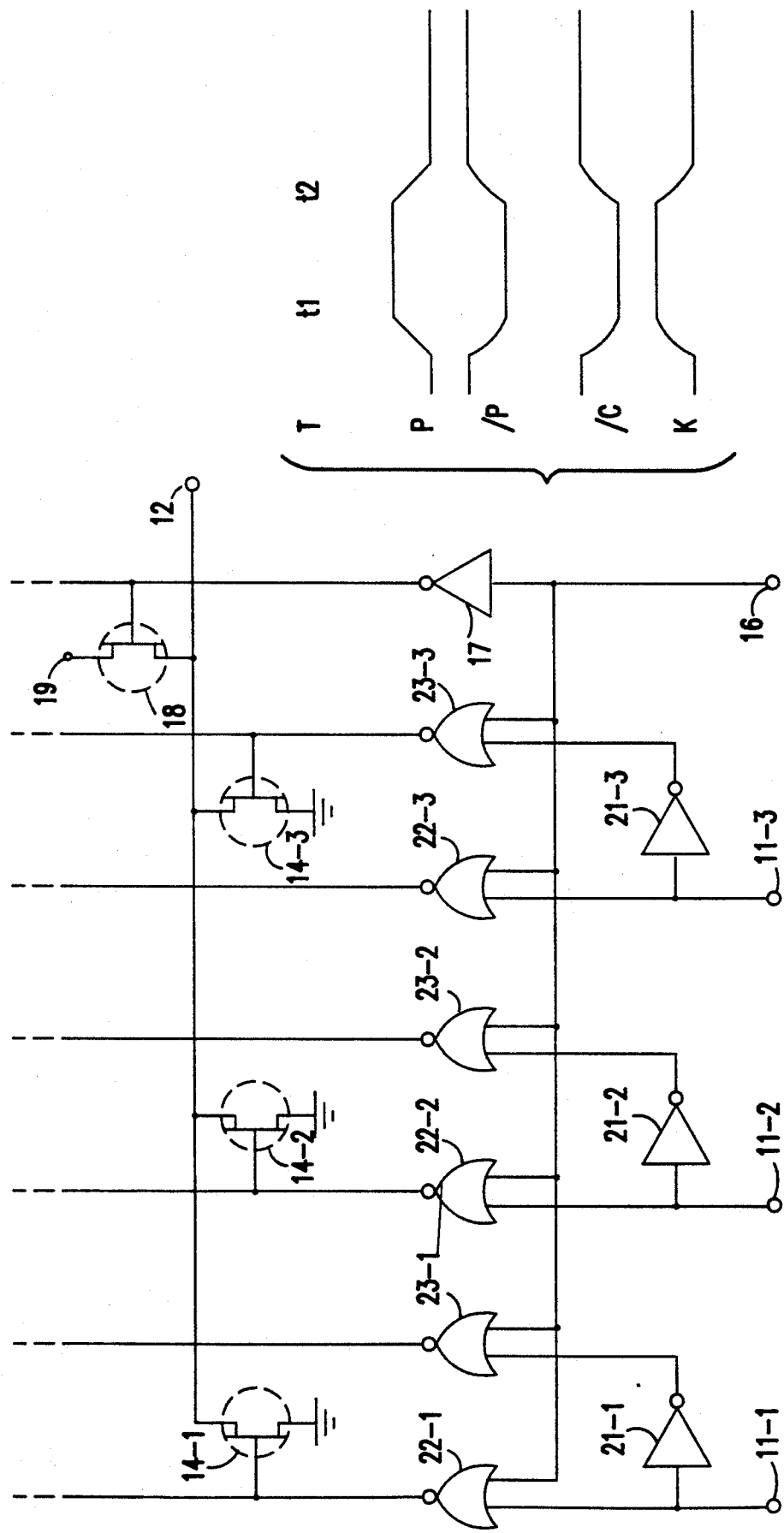
PRIOR ART
FIG.2
PRIOR ART
FIG.1

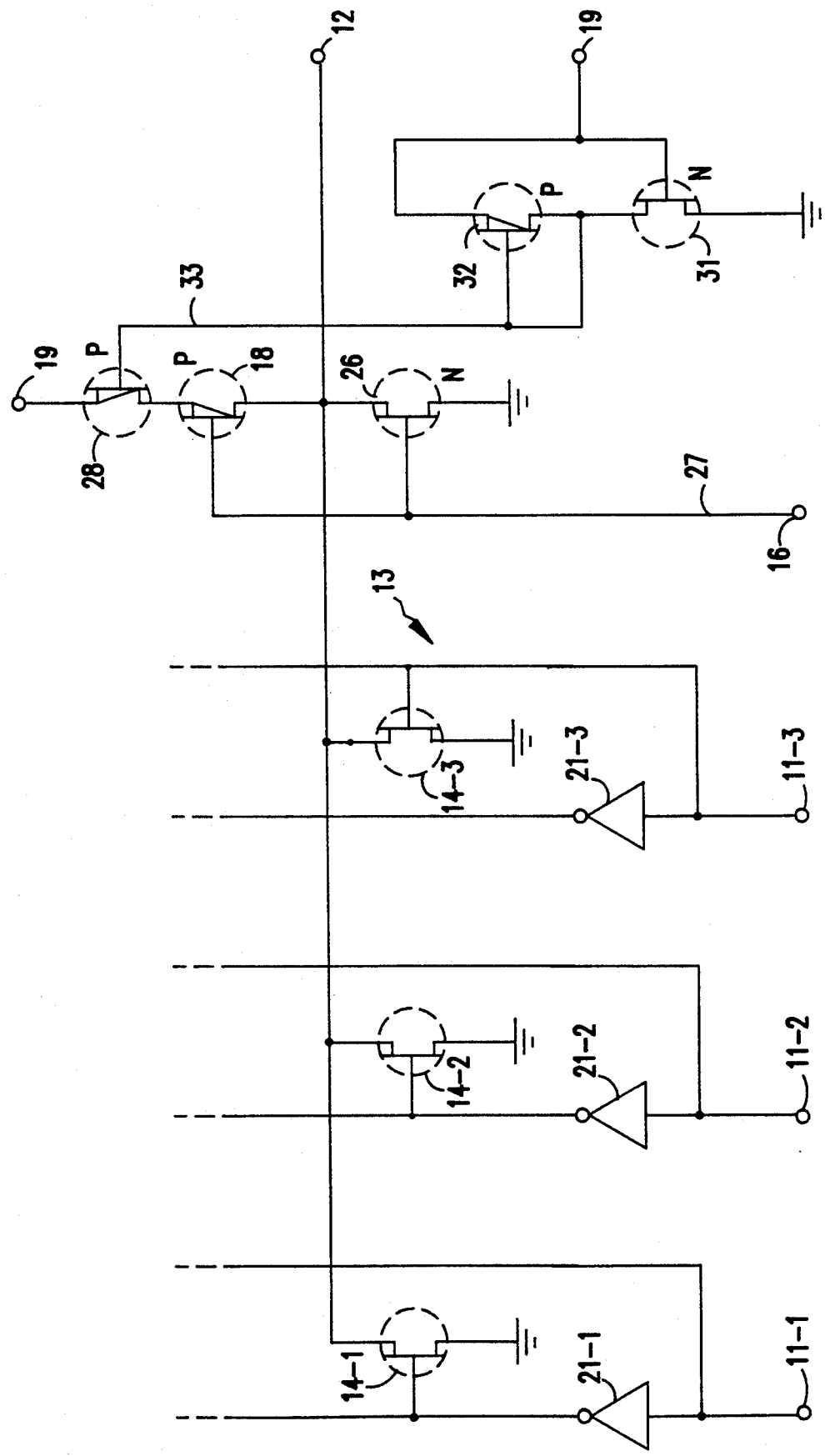
FIG.3

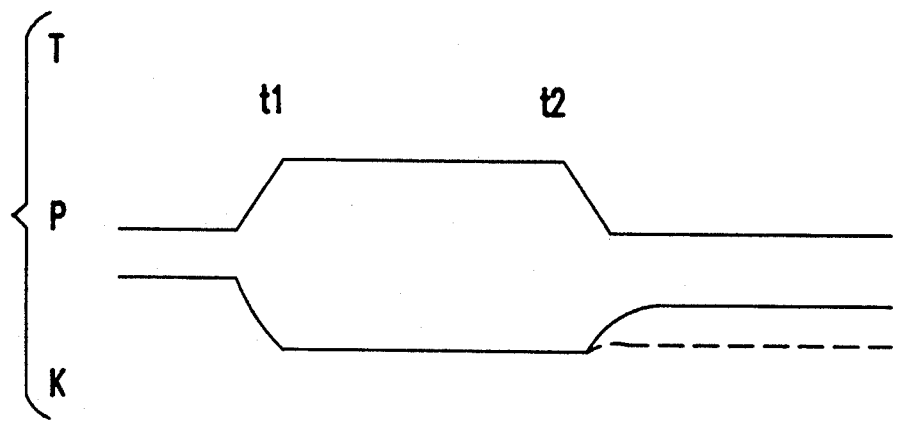
FIG.4
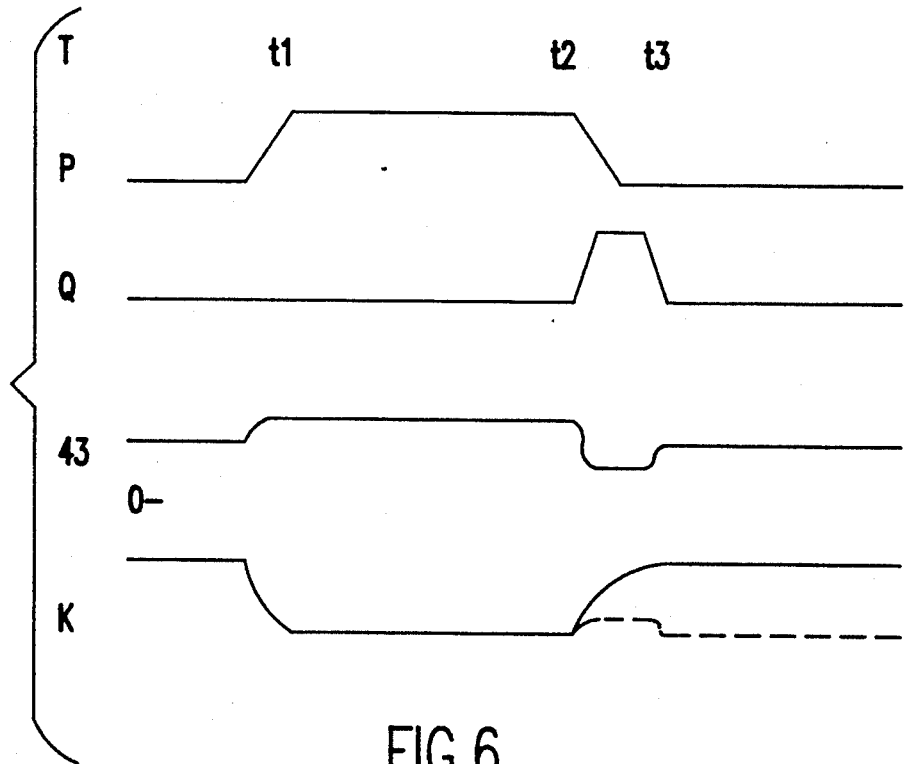
FIG.6

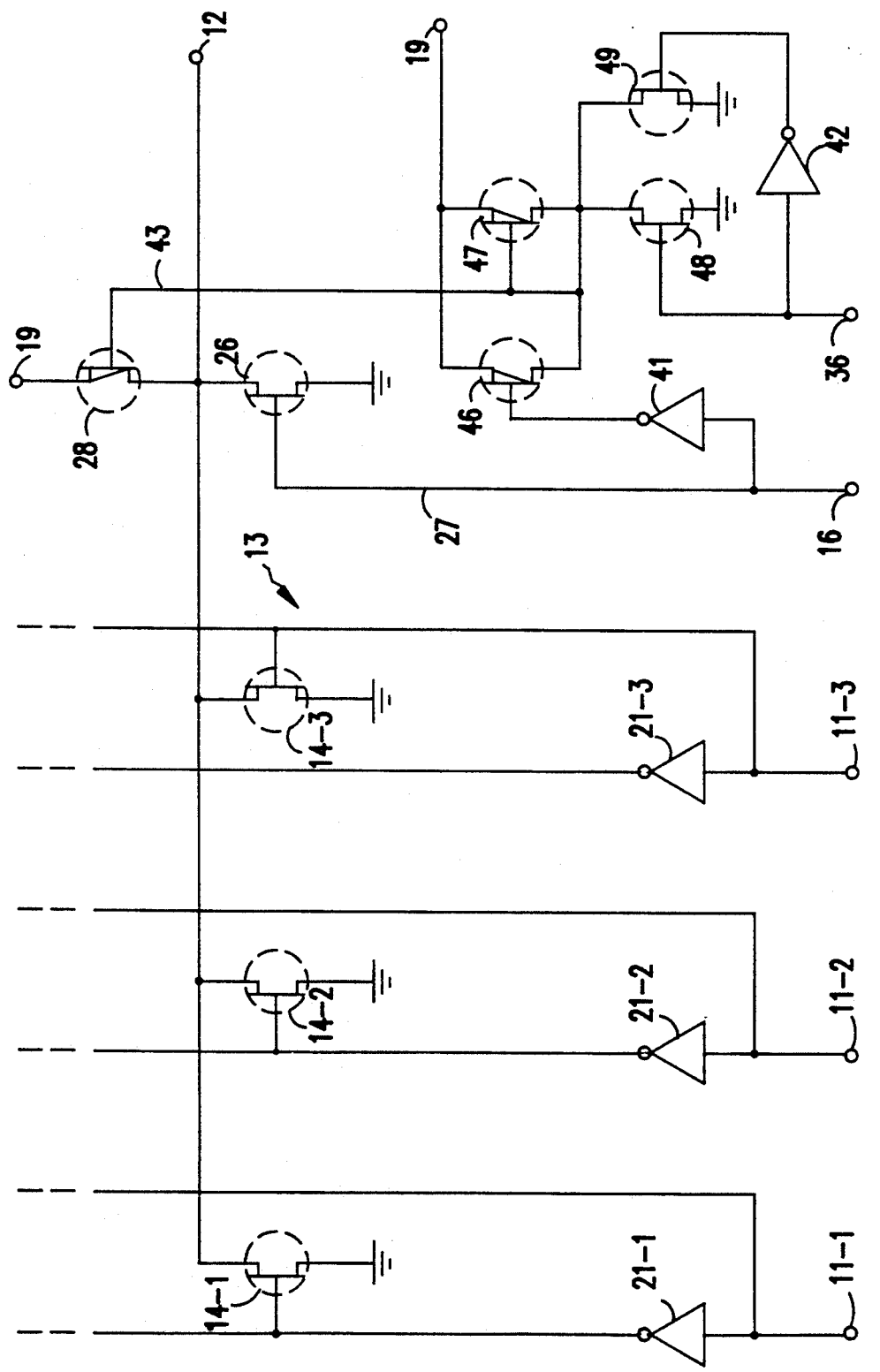
FIG.5

SEMICONDUCTOR DECODING DEVICE COMPRISING AN MOS FET FOR DISCHARGING AN OUTPUT TERMINAL

BACKGROUND OF THE INVENTION

This invention relates to a semiconductor integrated circuit (IC) operable as a semiconductor decoding device which comprises a plurality of MOS (metal-oxide semiconductor) field-effect transistors (FETS). Such a semiconductor decoding device is used, for example, as an address decoder for use in combination with a memory device.

In the manner known in the art, a semiconductor decoding device has a first plurality of device input terminals and a second plurality of device output terminals. When the first plurality is equal to three, the second plurality is equal to eight or less.

The device input terminals are supplied with a plurality of binary device input signals, equal in number to the first plurality. From time to time, the device input signals are variable between first and second input levels, such as binary one and binary zero input levels, independently of one another. The device input signals therefore have an input level combination of the first and the second input levels at any given time. It should be noted in this connection that the combination may be given either by the device input signals having the first input level alone in common or by the device input signals having the second input level alone in common.

In a specific case, the semiconductor decoding device may have a predetermined plurality of device input terminals and only one device output terminal. In this event, the input level combination should become a predetermined combination of the first and the second input levels during a certain time interval. The semiconductor decoding device decodes the first and the second input levels of the predetermined combination into a decoded level for supply to the device output terminal with a decoded signal having the decoded level as a device output signal during the time interval under consideration.

In the manner which will later be described in detail, a conventional semiconductor decoding device comprises a parallel circuit of a plurality of MOS field effect transistors of a predetermined conductivity type, such as an n-channel type, equal in number to the predetermined plurality. The parallel circuit is connected to the output terminal. A signal supply section is connected to the parallel circuit for supplying the device input signals to the respective (MOS) field effect transistors. A load circuit is connected to the output terminal and consequently to the parallel circuit. A power supply section is connected to the load circuit for supplying electric power to the load circuit.

In such a semiconductor decoding device, the load circuit has an active and an inactive state. When put in the active state during a first time interval, the load circuit supplies the electric power to the parallel circuit and to the device output terminal. When put in the inactive state during a second time interval, the load circuit inhibits supply of the electric power to each of the parallel circuit and the device output terminal. The device output signal of the decoded level is produced when the load circuit is put in the active state in the time interval in which the device input signals have the predetermined combination of the first and the second input levels.

In the semiconductor decoding device of this kind, the output terminal is charged by the electric power through the load circuit put in the active state. This makes the device output signal have a binary one output level, which may serve as the decoded level. When it is desired to give a binary zero output level to the device output signal, the device output terminal must be discharged.

In order to discharge the device output terminal, the conventional semiconductor decoding device comprises a plurality of NOR gates, equal in number to twice the above-mentioned first plurality even when the second plurality is equal to a half of a three-term algebraic sum of the first plurality square minus the first plurality plus two. As a result, the conventional semiconductor device has a degraded degree of integration. In addition, charge/discharge must be repeated at a cycle composed of the first and the second time intervals. This results in an objectionably great current consumption.

SUMMARY OF THE INVENTION

It is therefore an object of the present invention to provide a semiconductor decoding device which can be implemented as a semiconductor integrated circuit of an excellently high degree of integration.

It is another object of this invention to provide a seimconductor decoding device which is of the type described and in which current consumption is appreciably reduced.

Other objects of this invention will become clear as the description proceeds.

On setting forth the gist of this invention, it is possible to understand that a semiconductor decoding device has an output terminal and includes: (a) a parallel circuit of a plurality of MOS field effect transistors of a predetermined conductivity type connected to the output terminal, (b) signal supply means connected to the parallel circuit for supplying the parallel circuit with input signals which are equal in number to the above-mentioned plurality and have a predetermined combination of first and second input levels, (c) a load circuit connected to the output terminal, and (d) power supply means connected to the load circuit for supplying electric power to the load circuit to make the semiconductor decoding device decode the first and the second input levels of the predetermined combination into a decoded level for supply to the output terminal with a decoded signal having the decoded level.

According to this invention, the above-understood semiconductor decoding device comprises: (A) a charge control circuit comprising an additional MOS field effect transistor of the predetermined conductivity type connected to the output terminal and having a conductive and a non-conductive state; and (B) charge control means connected to the load circuit and the additional MOS field effect transistor for putting the load circuit in an inactive state and the additional MOS field effect transistor in the conductive state during a first time interval and the load circuit in an active state and the additional MOS field effect transistor in the non-conductive state during a second time interval.

BRIEF DESCRIPTION OF THE DRAWING

FIG. 1 is a block diagram of a conventional semiconductor decoding device;

FIG. 2 is a time chart for use in describing operation of the conventional semiconductor decoding device illustrate in FIG. 1;

FIG. 3 is a block diagram of a semiconductor decoding device according to a first embodiment of the instant invention;

FIG. 4 is a time chart for use in describing operation of the semiconductor decoding device depicted in FIG. 3;

FIG. 5 is a block diagram of a semiconductor decoding device according to a second embodiment of this invention; and FIG. 6 is a time chart for use in describing operation of the semiconductor decoding device illustrated in FIG. 5.

DESCRIPTION OF THE PREFERRED EMBODIMENTS

Referring to FIG. 1, a conventional semiconductor decoding device will first be described in order to facilitate an understanding of the present invention. The semiconductor decoding device is for use as, for example, an address decoder, is typically implemented as a semiconductor integrated circuit (IC), and has a first plurality of device input terminals and a second plurality of device output terminals.

In the example being illustrated, the first plurality is equal to three. As a consequence, the device input terminals are first through third device input terminals 11-1, 11-2, and 11-3. A pair of device input conductors is connected to each of the device input terminals 11 (suffixes omitted). In the manner which will become clear as the description proceeds, one of the device input conductors may be called an input signal conductor. The other of the device input conductors may be called an inverted signal conductor. The semiconductor decoding device therefore comprises first through third device input conductor pairs, each composed of the input signal conductor and the inverted signal conductor.

First through third binary device input signals A, B, and C are supplied to the first through the third device input terminals 11 and are variable from time to time between first and second input levels independently of one another. Without loss of generality, the first and the second input levels are binary one and binary zero input levels. The device input signals A through C therefore have an input level combination of the binary one level and/or the binary zero level at a time.

The semiconductor decoding device is for decoding such input level combinations into a plurality of decoded or output level combinations from time to time. Each of the output level combinations is represented by a plurality of decoded signals or device output signals, which are equal in number to the second plurality and are delivered to the respective device output terminals. In the example being illustrated, the second plurality is equal to eight.

Depending on the circumstances, only a predetermined number of the output level combinations are necessary. In any event, a device output terminal 12 alone is depicted. A single device output conductor is connected to the device output terminal 12. A device output signal K is delivered to the device output terminal 12 through the device output conductor and has one of first and second output levels at a time. Again without loss of generality, the decoded level may be the first output level. The first and the second output levels may be binary one and binary zero output levels.

The semiconductor decoding device comprises a transistor parallel circuit 13 of first through third MOS (metal-oxide semiconductor) field effect transistors (FETs) 14-1, 14-2, 14-3 of a first or predetermined conductivity type. In the example being illustrated, the first conductivity type is an n-channel type. Each of the (MOS) field effect transistors 14 (suffixes omitted) has a gate electrode and source and drain electrodes.

In order to give the semiconductor decoding device a built-in NOR logic for decoding a predetermined combination of the input level combinations into one of the output level combinations in the manner which will presently be described, first through third selected conductors are selected from the input and the inverted signal conductors of the first through the third device input conductor pairs, respectively. The gate electrodes of the first through the third field effect transistors 14 are connected to the first through the third selected conductors. The source and the drain electrodes are connected to the device output conductor and to ground. In this manner, the parallel circuit 13 of the filed effect transistors 14 is connected to the device output terminal 12.

The semiconductor decoding device has a control input terminal 16 supplied with a control input signal P variable between first and second control levels which may be binary one and binary zero control levels. A control input conductor is connected to the control input terminal 16 through, in the example being illustrated, a control input inverter 17.

A load circuit comprises a load MOS field effect transistor 18 of a second or opposite conductivity type which is a p-channel type in the illustrated example. The load (MOS) field effect transistor 18 has a gate electrode and source and drain electrodes. The gate electrode of the load field effect transistor 18 is connected to the control input conductor. The source and the drain electrodes are connected to a power source terminal 19 and to the device output conductor. In this manner, the load circuit (18) is connected to the device output terminal 12 and to the transistor parallel circuit 13.

The power source terminal 19 is supplied from a power source (not shown) with electric power of a power source potential V. It is now understood that the power source terminal 19 serves as a power supply section. Connected to the load circuit, the power supply section (19) supplies the electric power to the load circuit.

Comprising the load field effect transistor 18 controlled by the control input signal P in the manner which will shortly be described, the load circuit has an active and an inactive state. When put in the active state, the load circuit supplies the electric power to the device output terminal 12 and to the transistor parallel circuit 13. When put in the inactive state, the load circuit inhibits supply of the electric power to the device output terminal 12 and to the transistor parallel circuit 13.

First through third input signal inverters 21-1, 21-2, and 21-3 are connected to the first through the third device input terminal 11. In the manner which will very soon be described more rigorously, the input signal conductors of the first through the third device input conductor pairs are connected directly to the first through the third device input terminals 11. The inverted signal conductors of the first through the third device input conductor pairs are connected to the first through the third input signal inverters 21 (suffixes omitted).

It should be noted that the conventional semiconductor decoding device comprises first through third primary NOR gates 22-1, 22-2, and 22-3 and first through third secondary NOR gates 23-1, 23-2, and 23-3. Each of the first through the third primary and secondary NOR gates 22 and 23 (suffixes omitted) has two circuit input terminals and a circuit output terminal. It may be mentioned here that a control input branch is branched from the control input conductor at a point of connection between the control input terminal 16 and the control input inverter 17.

Referring more particularly to FIG. 1, the input signal conductors of the first through the third device input conductor pairs are connected to the output terminals of the first through the third primary NOR gates 22. The inverted signal conductors of the first through the third device input conductor pairs are connected to the output terminals of the first through the third secondary NOR gates 23. Ones of the input terminals of the first through the third primary NOR gates 22 are connected directly to the first through the third device input terminals 11. Ones of the input terminals of the first through the third secondary NOR gates 23 are connected to the first through the third input signal inverters 21. Others of the input terminals of the first through the third primary and secondary NOR gates 22 and 23 are connected to the control input branch.

In the example being illustrated, the first and the second selected conductors are the input signal conductors of the first and the second device input conductor pairs. The third selected conductor is the inverted signal conductor of the third device input conductor pair. These and others of the input and the inverted signal conductors of the first through the third device input conductors pairs are connected to seven other transistor parallel circuits (not shown), if desired.

Turning to FIG. 2 with FIG. 1 continually referred to, first and second time instants t1 and t2 are illustrated along a first or top row labelled T and are followed by a third time instant T3 (not shown). In the manner known in the art, the first through the third time instants are defined by clock pulses of a sequence. The first through the third (binary) device input signals A to C are variable between the first and the second input levels at, for example, the second time instant t2, keeping the binary one and/or the binary zero input levels throughout a first time interval between the first and the second time instants and throughout a second time interval between the second and the third time instants.

It will be presumed in the manner exemplified along a second row labelled P that the control input signal P builds up at the first time instant T1 from the binary zero control level to the binary one control level and builds down at the second time instant t2 from the binary one control level to the binary zero control level. Under the circumstances, the control input inverter 17 supplies the control input conductor with an inverted control signal /P which varies substantially between the binary zero and the binary one control levels in the manner depicted along a third row labelled /P.

When the control input signal P has the binary one control level, the load field effect transistor 18 is given at its gate electrode with a substantially zero control level and therefore puts the load circuit in the active state. When the control input signal has the binary zero control level, the load circuit is put in the inactive state.

So long as the control input signal P has the binary one control level, the first through the third primary and secondary NOR gates 22 and 23 deliver the first through the third device input signals A to C to the input and the inverted signal conductors of the first through the third device input conductor pairs with a common level which is substantially equal to the binary zero input level. In this event, each of the first through the third field effect transistors 14 is given a substantially zero input level at their gate electrodes and is put in an off state irrespective of the binary one and the binary zero input levels of the device input signals A to C. This makes the device output conductor have a substantially source potential V in cooperation with the load circuit put in the conductive state in the meantime. As a consequence, the device output signal K is given the binary one output level which is substantially equal to the source potential V.

It will temporarily be assumed that each of the first through the third device input signals A to C has the binary one input level throughout the first through the third time instants t1 to t3. Attention will be directed mainly to the first through the third selected conductors among the input and the inverted signal conductors of the first through the third device input conductor pairs.

When the control input signal P is given the binary zero control level at the second time instant t2, the first and the second primary NOR gates 22-1 and 22-2 deliver the first and the second device input signals A and B to the first and the second selected conductors substantially with the binary zero input level. Given the substantially zero input level at the gate electrode, each of the first and the second field effect transistors 14-1 and 14-2 is put in the off state. Concurrently, the third secondary NOR gate 13-3 delivers the third device input signal C to the third selected conductor substantially with the binary one input level. Given a substantially one input level at the gate electrode, the third field effect transistor 14-3 is put in an on state. As a result, the device output conductor is given a substantially zero potential in cooperation with the load circuit put meanwhile in the inactive state. This makes the device output signal K have the binary zero output level which is substantially equal to the zero potential.

It will now be assumed that the first through the third device input signals A to C have the first and/or the second input levels of one of various input level combinations during at least one of the first, the second, and like time intervals. Only one case will be taken into consideration where the device input signals A through C have the binary one input level in common during the first time interval and the binary one, the binary one, and the binary zero input levels as a predetermined combination (1, 1, 0) during the second time interval. Having the built-in NOR logic, the illustrated example is for making the device output signal K have the binary one output level as the decoded level only when the first through the third device input signals A to C have the predetermined combination of the first and the second input levels among the various input level combinations.

During the first time interval, the first through the third second NOR gates 23 deliver inverted input signals to the respective inverted signal conductors. The third device input signal C is therefore delivered to the inverted signal conductor of the third device input conductor pair as an inverted third input signal /C of the substantially zero input level in the manner depicted along a fourth row labelled /C. The device output signal K is given the binary one output level as illustrated along a fifth or bottom row labelled K.

During the second time interval, each of the first through the third field effect transistors 14 is given at its gate electrode the substantially zero input level. The field effect transistors 14 are therefore put in the off state. The load circuit is in the inactive state. The device output signal K nevertheless keeps the binary one output level. This is because the device output terminal 12 has a capacitance which is charged by the electric power during the first time interval.

Reviewing FIGS. 1 and 2, it is now understood that a combination of the first through the third device input terminals 11 and the first through the third input signal inverters 21 exemplifies a signal supply section. Connected to the transistor parallel circuit 13 in the manner described above, the signal supply section (11, 21) supplies the parallel circuit 13 with a plurality of device input signals, such as A through C, which are equal in number to the first plurality and each of which has a signal input level variable between first and second input levels from time to time. The device input signals are given the first and the second input levels of a predetermined combination, such as (1, 1, 0), at a time instant. When supplied with the electric power, the semiconductor decoding device decodes the first and the second input levels of the predetermined combination into a decoded signal for supply to the device output terminal 12, as the device output signal, a decoded signal having the decoded level as one of first and second output levels.

In the conventional semiconductor decoding device, the device output terminal 12 is charged in the manner pointed out above in order to make the device output signal K keep the binary one output level after supply of the electric power to the device output terminal 12 is stopped. The device output terminal 12 must therefore be discharged on making the device output signal K have the binary zero output level. In other words, the input and the inverted signal conductors of the first through the third device input conductor pairs must be supplied with the substantially zero input level in common.

The conventional semiconductor decoding device therefore comprises the first through the third primary and secondary NOR gates 22 and 23. Such NOR gates 22 and 23 are equal in number to twice the first plurality. A considerable number of the NOR gates are used when the first plurality is equal to a considerably great number. As a result, the conventional semiconductor decoding device has a degraded degree of integration.

Furthermore, charge/discharge of the device output terminal 12 is repeated whenever the input level combination varies from one to another. Consequently, the power source is subjected to an objectionably great current consumption I(1).

On quantitatively describing the charge/discharge, attention will be directed to only one of the first through the third device input conductor pairs that is related to one of the field effect transistors 14 of the transistor parallel circuit 13 and to a pair of the primary and the secondary NOR gates 22 and 23. It will additionally be surmised that the input level combination varies from one combination to another at a cycle T. Under the circumstances, the current consumption I(1) is given by a formula:

$$CV/T,$$

where C represents a capacitance had by the above-mentioned pair of the NOR gates 22 and 23 on their output sides, V representing the power source potential as above.

Referring now to FIG. 3, the description will proceed to a semiconductor decoding device according to a first embodiment of this invention. The semiconductor decoding device comprises similar parts which are designated by like reference numerals and are similarly operable with likewise named signals. In accordance with this invention, use is made of neither the first through the third primary and secondary NOR gates 22 and 23 discussed above nor the control input inverter 17 described in conjunction with FIG. 1. The control input branch is unnecessary.

In marked contrast to the conventional semiconductor decoding device illustrated with reference to FIG. 1, no NOR gates are used as above in order to make it possible to implement the semiconductor decoding device as a semiconductor integrated circuit of an excellently high degree of integration. Consequently, the input signal conductors of the first through the third device input conductor pairs are connected directly to the first through the third device input terminals 11. The inverted input conductors of the first through the third device input conductor pairs are connected directly to the first through the third input signal inverters 21 and thence to the first through the third device input terminals 11.

Furthermore, the inverted signal conductors of the first and the second device input conductor pairs are used as the first and the second selected conductors, to which the first and the second field effect transistors 14-1 and 14-2 are connected. The input signal conductor of the third device input conductor pair is used as the third selected conductor, to which the third field effect transistor 14-3 is connected.

Unlike in the conventional semiconductor decoding device described with reference to FIGS. 1 and 2, the control input signal P is used in controlling the load circuit alone with no control input inverter used. In the manner which will presently be described, the load circuit is improved to reduce the current consumption. The load circuit nevertheless has the active and the inactive states. More in particular, the load circuit is rendered active and inactive when the control input signal is given the binary zero and the binary one control levels, respectively.

The signal supply section is therefore composed of only the device input terminals 11, the input signal inverters 21, and the input and the inverted signal conductors of the device input conductor pairs. Connected to the transistor parallel circuit 13 comprising a plurality of MOS field effect transistors 14 of a predetermined conductivity type, equal in number to the first or the predetermined plurality, the signal supply section (11, 21) supplies the device input signals to the parallel circuit 13.

In the example being illustrated, the first through the third field effect transistors 14 are put in their off states when the first and/or the second input levels of the first through the third device input signals A to C are of the predetermined combination (1, 1, 0). Under the circumstances, the transistor parallel circuit 13 will be said to be in an off state. Otherwise, at least one of the first through the third field effect transistors 14 is put in its on state. In this event, the parallel circuit 13 will be said to be in an off state.

The device input signals, such as A through C, may have one of the input level combinations during at least one of consecutive periods, each composed of the first and the second time intervals, and may be switched to have another of the input level combinations at one of the time instants, such as at the second time instant t2 describe din connection with FIG. 2, that separates the periods. The control input signal P is given the binary one control level during a particular time interval, such as in the first time interval, and is given the binary zero control level, that immediately follows the particular time interval.

Referring more specifically to FIG. 3, the semiconductor decoding device comprises an additional MOS field effect transistor 26 of the first conductivity type. The additional (MOS) field effect transistor 26 has a gate electrode and source and drain electrodes. The gate electrode of the additional field effect transistors 26 is connected to the control input conductor, which is now directly connected to the control input terminal 16 and is designated by a reference numeral 27. The source and the drain electrodes are connected to the device output conductor and to ground. In this manner, the additional field effect transistor 26 is connected to the device output terminal 12 and is supplied with the control input signal P.

The additional field effect transistor 26 serves as a control circuit which is connected to the device output terminal 12 and supplied with the control input signal P. Comprising the additional field effect transistor 26 of the n-channel type in the example being illustrated, the control circuit (26) is put in a conductive state when the control input signal P has the binary one control level. In this event, the device output signal K is given the binary zero output level irrespective of the on and the off states of the transistor parallel circuit 13, namely, regardless of the input level combinations had by the device input signals, such as A through C. When the control input signal has the binary zero control level, the control circuit is put in a non-conductive state. In this case, the device output signal is given one of the binary one and the binary zero output levels in the manner which will shortly be described. A combination of the control input terminal 16 and the control input conductor 27 is herein referred to as a charge control section.

In addition to the load field effect transistor 18 describe din connection with FIG. 1, the load circuit comprises a current limiting MOS field effect transistor 28 which is of the second conductivity type and has a gate electrode and source and drain electrodes. Using the source and the drain electrodes of the current limiting (MOS) field effect transistor 28, the load field effect transistor 18 is connected to the power source terminal 19. In this manner, the current limiting field effect transistor 28 serves as a connecting section for connecting the load field effect transistor 18 to the power source terminal 19.

The gate electrode of the current limiting field effect transistor 28 is grounded through a current limiting circuit for limiting a load current which flows through the load and the current limiting field effect transistors 18 and 28 when the load circuit is put in the active state.

The current limiting circuit comprises a first current control MOS field effect transistor 31 of the first conductivity type and a second current control MOS field effect transistor 32 of the second conductivity type. Each of the current control (MOS) field effect transistors 31 and 32 has a gate electrode and source and drain electrodes.

Using the source and the drain electrodes, the first and the second current control field effect transistors 31 and 32 are connected in series between ground and the power source terminal 19 which is depicted separately from that connected to the current limiting field effect transistors 28. The first and the second current control field effect transistors 31 and 32 are nearer to the ground and to the current limiting field effect transistor 28.

The gate electrode of the current limiting field effect transistor 28 is connected through a grounding conductor 33 to a point of connection between the first and the second current control field effect transistors 31 and 32. The gate electrode of the first current control field effect transistor 31 is connected to the power supply terminal 19. The gate electrode of the second current control field effect transistor 32 is connected to the grounding conductor 33 and therefore to the point of connection, namely, to its drain electrode.

Preferably, each of the current limiting and the first current control field effect transistors 28 and 31 has a predetermined channel length L and a predetermined channel width W which are had by each of the first through the third field effect transistors 14. The second current control field effect transistor 32 has the predetermined channel length and a twice channel width which is equal to twice the predetermined channel width. For example, the predetermined channel length L is equal to 1 micron and the predetermined channel width W, equal to 2 microns. Under the circumstances, the second current control field effect transistor 32 should have a channel length of 1 micron and a channel width of 4 microns.

A current mirror circuit is formed by the current limiting and the second current control field effect transistors 28 and 32. The current limiting field effect transistor 28 is therefore given a current drive capability which is equal to a half of that of each of the first through the third field effect transistors 14. In other words, the load current is limited to a half of the current drive capability of each of the first through the third field effect transistors 14.

Such a limited load current is obtained also by making the first current control field effect transistor 31 have the predetermined channel length L and a half channel width which is equal to a half of the predetermined channel width W. In this event, each of the current limiting and the second current control field effect transistors 28 and 32 should have the predetermined channel length L and the predetermined channel width W. Alternatively, it is possible to likewise use a load current which is limited to a third of the current drive capability of each of the first through the third field effect transistors 14.

Being of the n-channel type in the illustrated example and supplied with the power source potential V at the gate electrode, the first current control field effect transistor 31 is always kept in an on state. The second current control field effect transistor 32 is also kept in its on state because it is of the p-channel type in the example being illustrated and because its gate electrode is given a substantially zero potential through the first current control field effect transistor 31. It should, however, be noted that substantially no source-drain current flows through the second current control field effect transistor 32. This is because its gate and drain electrodes are given the substantially zero potential in common.

It is now obvious from the foregoing that the current limiting field effect transistor 28 is always kept in an on state irrespective of the first and the second control levels of the control input signal P because it is of the p-channel type in the illustrated example and its gate electrode is given the substantially zero potential through the grounding conductor 33. The load field effect transistor 18 is operable in the manner described before in conjunction with FIG. 1.

It is now understood that the load circuit is put in the active state of delivering the limited load current towards the device output terminal 12, the transistor parallel circuit 13, and the control circuit with the substantially source potential V when the control input signal P has the binary zero control level. When the control input signal has the binary one control level, the load circuit is put in the inactive state.

It will now be surmised that the device input signals, such as A through C, have the predetermined combination of the first and/or the second input levels. In the manner mentioned above, the control input signal P of the binary one control level puts the load circuit in the inactive state. In the meantime, the control circuit is put in the conductive state. Under the circumstances, the device output signal K is given the binary zero output level even if the transistor parallel circuit 13 is put in the off state.

When the device input signals have the predetermined combination in this manner, the control input signal of the binary zero control level puts the load circuit in the active state. Meanwhile, the control circuit is put in the non-conductive state. Under the circumstances, the device output signal is given the binary one output level if the parallel circuit 13 is put in the off state. The device output signal is given a nearly zero potential as the binary zero output level if the parallel circuit 13 is put in the on state. The nearly zero to potential depends on a ratio of the current drive capability of the current limiting field effect transistor 28 to the current drive capability of one of the field effect transistors 14 of the parallel circuit 13 that is put in the on state. If at least two of the field effect transistors 14 are put in their on states, the nearly zero potential depends on another ratio of the current drive capability of the current limiting field effect transistor 28 to a sum of the current drive capabilities of the field effect transitions 14 put in their on states in the parallel circuit 13.

Reviewing FIG. 3, only three MOS field effect transistors 28, 31, 32 and a certain number of additional MOS field effect transistors, one 26 for each output terminal 12, are substituted in the illustrated semiconductor decoding device for the NOR gates which must be crowded near the device input terminals 11 in the prior art device. The illustrated semiconductor decoding device is therefore implemented as a semiconductor integrated circuit of a high degree of integration either when the device output terminals, such as 12, are less in number or when the device input terminals 11 are four or less in number. Furthermore, discharge is carried out with no NOR gates used but by cooperation of the charge control circuit comprising the additional MOS field effect transistors and the charge control section comprising the control input conductor 27 and supplied with the control input signal P. If desired, the semiconductor decoding device need not include the current limiting and the first and the second current control field effect transistors 28, 31, and 32.

In addition, it is possible to achieve a reduction in the current consumption by avoiding the charge/discharge of the output terminals, such as 12, with no NOR gates used so long as the device input signals continuously have one of various input level combinations in the manner which will later be discussed. The reduction is additionally attained by the current limiting field effect transistor 28 and the current limiting circuit comprising the first and the second current control field effect transistors 31 and 32 and the grounding conductor 33 and connected to the current limiting field effect transistor 28 so as to limit the load current which flows through the load field effect transistor 18 put in the on state. Such a load current limiting section is additionally advantageous in improving the binary zero output level which each device output signal, such as K, has when the load circuit is put in the active state while a pertinent one of a plurality of transistor parallel circuits, such as 13, is put in its on state.

Turning to FIG. 4 with FIG. 3 continuously referred to, first and second time instants t1 and t2 are illustrated like in FIG. 2 along a first or top row labelled T and are followed by a third time instant t3 (not shown). Time intervals between two adjacent ones of the time instants will be called first and second time intervals as before. Again like in FIG. 2, it will be presumed in the manner schematically shown along a second row labelled P that the control input signal P has the binary one control level throughout the first time interval and the binary zero control level throughout the second time interval.

During the first time interval, the control circuit is put in the conductive state. The load circuit is put in the inactive state. The device output signal consequently has the binary zero output level in the manner depicted along a third or bottom row labelled K irrespective of the input level combination of the first and/or the second input levels had by the device input signals, such as A through C.

During the second time interval, the control circuit is put in the non-conductive state. The load circuit is put in the active state. If the predetermined combination of the first and/or the second input levels is had by the device input signals, the binary one output level is given to the device output signal in the manner illustrated by a solid-line curve along the third row. Otherwise, the binary zero output level is given to the device output signal in the manner exemplified along the third row by a dashed-line curve.

Referring now to FIG. 5, attention will be directed to a semiconductor decoding device according to a second embodiment of this invention. Similar parts are designated again by like reference numerals and are similarly operable with likewise named signals. The illustrated example is different in structure from the semiconductor decoding device illustrated with reference to FIGS. 3 and 4 in the following respects.

The load circuit comprises the current limiting field effect transistor 28 alone. Its gate electrode is connected to a first control circuit which is connected to the additional field effect transistor 26 and is primarily for controlling on and off of the additional field effect transistor 26 and additionally operable to control turn off of the current limiting field effect transistor 28 and to thereby put the load circuit in the inactive state. The first control circuit is therefore different from the current limiting circuit described in conjunction with FIG. 3 as follows.

The control input signal P and the control input terminal 16 will now be called a first control input signal and a first control input terminal. The first control input signal has the first control level as a first primary or a binary one primary control level and the second control level as a second primary or a binary zero primary control level. A second control input terminal 38 is supplied with a second control input signal Q having a first secondary or a binary one secondary control level during the first time interval plus a portion of the second time interval immediately preceding the first time interval and a second secondary or a binary zero secondary control level only during a predetermined interval which immediately follows each build down of the first control input signal P from the binary one primary control level to the binary zero primary control level and which will presently be described more in detail. The above-mentioned portion of the second time interval is the second time interval less the predetermined interval.

In the first control circuit, a first control input inverter 41 is connected to the first control input terminal 16 to produce a first inverted control signal. By the way, a second control input inverter 42 is connected to the second control input terminal 36 to produce a second inverted control signal. The gate electrode of the current limiting field effect transistor 28 is connected to a local signal conductor 43 had by the first control circuit in the manner which will shortly be described.

A first load control MOS field effect transistor 46 is of the second conductivity type and has a gate electrode and source and drain electrodes. The gate electrode of the first load control (MOS) field effect transistor 46 is supplied with the first inverted control signal from the first control input inverter 41. The source and the drain electrodes are connected between the local signal conductor 43 and the power source terminal 19 which is depicted separately from that connected to the load circuit. Being of the p-channel type in the example being illustrated, the first load control field effect transistor 46 is turned on during the first time interval to supply the local signal conductor 43 with a substantially source potential V and is turned off during the second time interval to isolate the local signal conductor 43 from the first control input signal P and to thereby substantially isolate the current limiting field effect transistor 28 from the first control signal.

In a second control circuit which comprises the second control input inverter 42 and to which the gate electrode of the current limiting field effect transistor 28 is furthermore connected, a second load control MOS field effect transistor 47 is of the second conductivity type and has a gate electrode and source and drain electrodes. The gate electrode of the second load control (MOS) field effect transistor 47 is connected to the local signal conductor 43, which is shared by the first and the second control circuits. The source and the drain electrodes are connected to the power source terminal 19 and to the local signal conductor 43. The gate and the drain electrodes are therefore connected together at a point of connection.

A third load control MOS field effect transistor 48 is of the first conductivity type and has a gate electrode and source and drain electrode. The gate electrode of the third load control (MOS) field effect transistor 48 is connected to the second control input terminal 36. The source and the drain electrodes are connected to the local signal conductor 43 and to ground. Being of the n-channel type in the example being illustrated, the third load control field effect transistor 48 is turned on only during the predetermined interval to supply the local signal conductor 43 with a substantially zero potential and is turned off during a remaining portion of the first and the second time intervals, which remaining portion is the first and the second time intervals less the predetermined interval. Depending on the circumstances, this remaining portion need not be mentioned. In such an instance, the above-mentioned portion of the second time interval will be referred to as a remaining portion of the second time interval.

A fourth load control MOS field effect transistor 49 is of the first conductivity type and has a gate electrode and source and drain electrodes. The gate electrode of the fourth load control (MOS) field effect transistor 49 is supplied with the second inverted control signal from the second control input inverter 42. The source and the drain electrodes are connected to the local signal conductor 43 and to ground.

Being of the n-channel type in the example being illustrated, the fourth load control field effect transistor 49 is turned on during the remaining portion of the first and the second time intervals to supply the local signal conductor 43 with a somewhat different zero potential and is turned off during the predetermined interval. It is therefore understood that the first and the fourth load control field effect transistors 46 and 49 are concurrently turned on during the afore-mentioned portion of the second time interval. The fourth load control field effect transistor 49 is, however, possessed of a channel length and a channel width which render its current drive capability so small that the different zero potential scarcely affects the substantially source potential given to the local signal conductor 43 by the first load control field effect transistor 46 in the meantime. The fourth load control field effect transistor 49 may have a current drive capability which is less than several microamperes in practice.

Reviewing FIG. 5, only four MOS field effect transistors 46 through 49, a certain number of additional MOS field effect transistors, one 26 for each device output terminal 12, and only two inverters 41 and 42 are substituted in the illustrated semiconductor decoding device for the NOR gates used in the prior art device. Besides the discharge carried out without the NOR gates, the illustrated semiconductor decoding device is implemented as an integrated circuit of a high degree of integration either when the device output terminals, such as 12, are less in number or when the device input terminals 11 are five or less in number.

The charge control section comprises the first control circuit comprising, in turn, the first control input terminal 16, the control input and the local signal conductors 27 and 43, the first load control field effect transistor 46, and the first control input inverter 41. Connected to the additional and the current limiting field effect transistors 26 and 28 and supplied with the first control input signal P, the first control circuit (16, 27, 41, 43, 46) puts the additional field effect transistor 26 in the conductive state and the current limiting field effect transistor 28 in the off state to put the load circuit in the inactive state during the first time interval. During the second time interval, the first control circuit puts the additional field effect transistor 26 in the nonconductive state and substantially isolates the current limiting field effect transistor 28 from the first control input signal.

The load current limiting section comprises the second control circuit comprising, in turn, the second control input terminal 36, the local signal conductor 43 in common to the first control circuit, the second through the fourth load control field effect transistors 47 to 49, and the second control input inverter 42. Connected to the current limiting field effect transistor 28 and supplied with the second control input signal Q, the second control circuit (36, 42, 43, 47-49) is operable during the second time interval during which the current limiting field effect transistor 28 is substantially isolated from the first control input signal P and during which the additional field effect transistor 26 is put in the non-conductive state. More particularly, the second control circuit puts the current limiting field effect transistor 28 in the on state to put the load circuit in the active state throughout the predetermined interval and the remaining portion of the second time interval. During the remaining portion of the second time interval, the second control circuit causes a less load current to flow through the load circuit than during the predetermined interval.

Referring to FIG. 6 with FIG. 5 continuously referred to, first through third time instants t1 to t3 are illustrated along a first or top row labelled T and are followed by a fourth time instant t4 (not shown). It should be understood in this connection that the third time instant t3 is not determined by the clock pulses in relation to the first, the second, and the fourth time instants but is determined by the predetermined interval relative to the second time instant t2. Time intervals between the first and the second time instants t1 and t2 and between the second and the fourth time instants t2 and t4 are therefore the first and the second time intervals.

The first and the second control input signals P and Q are schematically depicted along second and third rows labelled P and Q. During the first time interval, the additional field effect transistor 26 and the first and the fourth load control field effect transistors 46 and 49 are turned on. The third load control field effect transistor 48 is turned off. The local signal conductor 43 is given the substantially source potential V in the manner exemplified along a fourth row labelled 43. This is because the fourth load control field effect transistor 49 has the current drive capability which scarcely affects the source potential given to the local signal conductor 43. The current limiting field effect transistor 28 is consequently put in the off state to put the load circuit in the inactive state. The device output signal K is given the binary zero level as illustrated along a fifth or bottom row labelled K.

In the predetermined interval between the second and the third time instants t2 and t3, the additional and the first and the fourth load control field effect transistors 26, 46, and 49 are turned off. The third load control field effect transistor 48 is turned on. The local signal conductor 43 is consequently given a nearly zero potential which is determined by the second and the third load control field effect transistors 47 and 48 and is exemplified along the fourth row. The current limiting field effect transistor 28 is put in the on state to put the load circuit in the active state.

If the device input signals, such as A to C, have the predetermined combination of the first and/or the second input levels in the meantime, the device output signal K is given the binary one output level in the manner shown along the fifth row by a solid-line curve. If the device input signals have an input level combination other than the predetermined combination, the device output signal K is given, in the manner depicted along the fifth row by a dashed-line curve, a nearly binary zero output level determined by a ratio of the current drive capability of the current limiting field effect transistor 28 to the current drive capability of each of the field effect transistors 14 that is put in the on state in the transistor parallel circuit 13.

During the remaining portion of the second time interval, the additional and the first and the third load control field effect transistors 26, 46, and 48 are turned off. The fourth load control field effect transistors 49 is turned on. The local signal conductor 43 is given another nearly zero potential which is a little higher than the nearly zero potential given to the local signal conductor 43 during the predetermined interval. This is because the fourth load control field effect transistor 49 has the small current drive capability.

As a consequence, the current limiting field effect transistor 28 is kept in its on state to put the load circuit continuously in the active state throughout the remaining portion of the second and the next following first time intervals until the device output signal K is again given the binary one output level. This makes the load current continuously flow although much reduced during the remaining portion of the first and the second time intervals by giving the binary zero secondary control level to the second control input signal Q in the meanwhile. In this manner, the load current is not reduced to zero. This is in order to prevent an adverse effect which might otherwise occur in the binary one output level from a leakage current or the like. Such a reduction in the load current well serves to kept the current consumption small. The predetermined interval is not critical and may be as short as 1 nanosecond.

Reviewing FIGS. 3 through 6, attention will be directed to the first device input signal A alone among the device input signals, such as A through C. In the manner described reviewing FIGS. 1 and 2, the charge/discharge results in a current consumption of CV/T if the device input signals have the first and/or the second input levels which vary from an input level combination to another at the cycle T. The charge/discharge, however, results in a current consumption which decreases to zero so long as the device input signals have the first and/or the second input levels of one of the input level combinations that is kept unchanged during a plurality of cycles. As a result, the charge/discharge gives rise to a reduced current consumption I(2) which is given on an average by a formula:

$$CV/(2T),$$

where the capacitance C is what is had by the output terminals, such as 12.

While this invention has thus far been described in specific conjunction with only two preferred embodiments thereof, it will now be readily possible for one skilled in the art to carry this invention into effect in various other manners. Above all, the first or the predetermined conductivity type can be the p-channel type and the second or the opposite conductivity type, the n-channel type.

What is claimed is:

1. A semiconductor decoding device having an output terminal and including a parallel circuit of a plurality of MOS field effect transistors of a predetermined conductivity type connected to said output terminal, signal supply means connected to said parallel circuit for supplying said parallel circuit with input signals which are equal in number to said plurality and have a predetermined combination of first and second input levels, a load circuit connected to said output terminal, and power supply means connected to said load circuit for supplying electric power to said load circuit, said semiconductor decoding device decoding the first and the second input levels of said predetermined combination into a decoded level and supplying to said output terminal a decoded signal having said decoded level, said semiconductor recording device comprising:

a charge control circuit comprising an additional MOS field effect transistor of said predetermined conductivity type connected to said output terminal and having a conductive and a non-conductive state, said charge control circuit being responsive to a charge control signal which puts said load circuit in an inactive state and said additional MOS field effect transistor in said conductive state in a first time interval and said load circuit in an active state and said additional MOS field effect transistor in said non-conductive state in a second time interval;

load current limiting means connected to said load circuit for limiting a load current which flows through said load circuit when said load circuit is put in said active state, comprising a load MOS field effect transistor of an opposite conductivity type which is opposite to said predetermined conductivity type, said load MOS field effect transistor being connected to said output terminal, and connecting means for connecting sad load MOS field effect transistor to said power supply means; and a control input conductor connected to said additional and said load MOS field effect transistors and supplied with a control input signal having a first control level during said first time interval and a second control level during said second time interval, the control input signal of said first control level being for putting said additional MOS field effect transistor in said conductive state and said load MOS field effect transistor in an off state to put said load circuit in said inactive state, the control input signal of said second control level being for putting said additional MOS field effect transistor in said non-conductive state and said load MOS field effect transistor in an on state to put said load circuit in said active state.

2. A semiconductor decoding device as claimed in claim 1, wherein:

said connecting means comprises a current limiting MOS field effect transistor which has said opposite conductivity type and through which and through said load MOS field effect transistor said load current flows when said load MOS field effect transistor is put in said on state, said current limiting MOS field effect transistor being capable of always allowing said load current to flow therethrough when energized by said power supply means and when said load MOS field effect transistor is put in said on state;

said load current limiting means comprising a current limiting circuit connected to said current limiting MOS field effect transistor for limiting the load current flowing therethrough while said load MOS field effect transistor is put in said on state.

3. A semiconductor decoding device having an output terminal and including a parallel circuit of a plurality of MOS field effect transistors of a predetermined conductivity type connected to said output terminal, signal supply means connected to said parallel circuit for supplying said parallel circuit with input signals which are equal in number to said plurality and have a predetermine combination of first and second input levels, a load circuit connected to said output terminal, and power supply means connected to said load circuit for supplying electric power to said load circuit, said semiconductor decoding device decoding the first and the second input levels of said predetermined combination into a decoded level and supplying to said output terminal a decoded signal having said decoded level, said semiconductor decoding device comprising;

a charge control circuit comprising an additional MOS field effect transistor of said predetermined conductivity type connected to said output terminal and having a conductive and a non-conductive state, said charge control circuit being responsive to a charge control signal which puts said load circuit in an inactive state and said additional MOS field effect transistor in said conductive state in a first time interval and said load circuit in an active state and said additional MOS field effect transistor in said non-conductive state in a second time interval;

load current limiting means connected to said load circuit for limiting a load current which flows through said load circuit when said load circuit is put in said active state, said load circuit comprising a current limiting MOS field effect transistor of an opposite conductivity type which is opposite to said predetermined conductivity type, said current limiting MOS field effect transistor being connected to said output terminal and said power supply means; and a first control circuit connected to said additional and said current limiting MOS field effect transistors and supplied with a first control input signal having a first primary control level during said first time interval and a second primary control level during said second time interval, the first control input signal of said first primary control level being for putting said adiditon a MOS field effect transistor in said conductive state and said current limiting MOS field effect transistor in an off state to put said load circuit in said inactive state, the first control input signal of said second primary control level being for putting said additional MOS field effect transistor in said non-conductive state and for substantially isolating said current limiting MOS field effect transistor from said first control input signal;

said load current limiting means further comprising a second control circuit connected to said current limiting MOS field effect transistor and supplied with a second control input signal having a first secondary control level during a predetermined interval immediately following said first time interval in said second time interval and a second secondary control level during a remaining portion of said second time interval, said remaining portion being equal to said second time interval less said predetermined interval, the second control input signal of said first and said second secondary control levels being for putting said current limiting MOS field effect transistor in an on state to put said load circuit in said active state, the second control input signal of said second secondary control level being for causing a less load current to flow through said load circuit than the second control input signal of said first secondary control level.

* * * * *